(12) United States Patent
Bhaskaran et al.

(10) Patent No.: US 10,985,318 B2
(45) Date of Patent: Apr. 20, 2021

(54) MEMRISTOR DEVICE AND A METHOD OF FABRICATION THEREOF

(71) Applicant: Royal Melbourne Institute of Technology, Melbourne (AU)

(72) Inventors: Madhu Bhaskaran, Docklands (AU); Sharath Sriram, Docklands (AU); Sumeet Walia, Docklands (AU); Hussein Nili Ahmadabadi, Santa Barbara, CA (US)

(73) Assignee: ROYAL MELBOURNE INSTITUTE OF TECHNOLOGY, Victoria (AU)

(*) Notice: Subject to any disclaimer, the term of this patent is extended or adjusted under 35 U.S.C. 154(b) by 0 days.

(21) Appl. No.: 15/778,776

(22) PCT Filed: Nov. 23, 2016

(86) PCT No.: PCT/AU2016/051145
§ 371 (c)(1),
(2) Date: May 24, 2018

(87) PCT Pub. No.: WO2017/088016
PCT Pub. Date: Jun. 1, 2017

(65) Prior Publication Data
US 2018/0351095 A1 Dec. 6, 2018

(30) Foreign Application Priority Data

Nov. 24, 2015 (AU) ................................ 2015904857

(51) Int. Cl.
*H01L 45/00* (2006.01)

(52) U.S. Cl.
CPC ............ *H01L 45/147* (2013.01); *H01L 45/08* (2013.01); *H01L 45/1253* (2013.01);
(Continued)

(58) Field of Classification Search
CPC ... H01L 45/147; H01L 45/08; H01L 45/1253; H01L 45/1625
See application file for complete search history.

(56) References Cited

U.S. PATENT DOCUMENTS

2010/0064397 A1 3/2010 Hrouzek
2010/0264397 A1* 10/2010 Xia ..................... H01L 27/101
257/4
(Continued)

FOREIGN PATENT DOCUMENTS

WO WO-2015034494 A1 * 3/2015 ......... H01L 45/1608

OTHER PUBLICATIONS

Yan et al. "Studies on the reset power needed for the unipolar resistive switching in amorphous SrTiO3-σ films induced by electrical pulse" Physics Letters A 375 (2011) 3599-3603 (Year: 2011).*
(Continued)

*Primary Examiner* — Sitaramarao S Yechuri
(74) *Attorney, Agent, or Firm* — Cantor Colburn LLP (57) ABSTRACT

A memristor device is disclosed comprising: a first electrode; a second electrode; a cathode metal layer disposed on a surface of the first electrode; and an active region disposed between and in electrical contact with the second electrode and the cathode metal layer, the active region comprising at least one layer of an amorphous metal oxide, wherein when a switching voltage is applied between the first and second electrodes, the active region exhibits a resistive switching behaviour. A method of fabricating a memristor device is also disclosed.

9 Claims, 3 Drawing Sheets

(52) U.S. Cl.
    CPC ........ *H01L 45/145* (2013.01); *H01L 45/1608* (2013.01); *H01L 45/1625* (2013.01)

(56) References Cited

U.S. PATENT DOCUMENTS

| | | | |
|---|---|---|---|
| 2013/0087755 A1 | 4/2013 | Prodromakis | |
| 2014/0017403 A1* | 1/2014 | Chu | C23C 16/06 427/250 |
| 2015/0048299 A1 | 2/2015 | Hwang | |
| 2017/0077182 A1* | 3/2017 | Strukov | H01L 27/2463 |

OTHER PUBLICATIONS

Gopalan et al. "Effect of niobium doping on the microstructure and electrical properties of strontium titanate thin films for semiconductor memory application" Applied Physics Letters vol. 75, No. 14 Oct. 4, 1999, American Institute of Physics (Year: 1999).*

International Search Report for corresponding application PCT/AU2016/051145 filed Nov. 23, 2016; dated Feb. 13, 2017.

Written Opinion of the International Searching Authority for corresponding application PCT/AU2016/051145 filed Nov. 23, 2016; dated Feb. 13, 2017.

Nili Hussein, et al., "Donor-Induced Performance Tuning of Amorphous SrTiO3 Memristive Nanodevices: Multistate Resistive Switching and Mechanical Tunability", Advanced Functional Materials, vol. 25, 21, pp. 3172-3182, Apr. 14, 2015.

Nili Hussein, et al., "Nanoscale Resistive Switching in Amorphous Perovskite Oxide (a-SrTiO3) Memristors", Advanced Functional Materials, vol. 24, 43, 2014, pp. 6741-6750, Aug. 26, 2014.

Extended European Search Report for corresponding European application 16867449.7; Report dated Jun. 21, 2019.

Japanese Office Action for corresponding application No. 2018-545530; Report dated Jan. 5, 2021.

* cited by examiner

MEMRISTOR DEVICE AND A METHOD OF FABRICATION THEREOF

TECHNICAL FIELD

The present invention relates to a memristor device and a method of fabrication thereof.

The invention has been developed primarily for use in compatible memristive systems and will be described hereinafter with reference to this application. However, it will be appreciated that the invention is not limited to this particular field of use.

BACKGROUND OF INVENTION

The following discussion of the background to the invention is intended to facilitate an understanding of the invention. However, it should be appreciated that the discussion is not an acknowledgement or admission that any of the material referred to was published, known or part of the common general knowledge in Australia or any other country as at the priority date of any one of the claims of this specification.

Memory technologies have traditionally been utilised to store digital data in the form of ones and zeros. Current interest on the other hand, lies in technologies that enable analogue memories to have multiple states. This enables unprecedented high density memories and most significantly neuromorphic computing. These interests rely on the electronic state of memories being highly non-volatile with durable and cyclic switching and easy differentiation between ON/OFF states. Nanoscale resistive memories (or "memristors") satisfy many of these requirements, and are reliant on functional oxides. They are normally configured as passive two terminal metal insulated metal (MIM) devices based on functional binary and ternary metal oxides (e.g. $TiO_2$, $SrTiO_3$). These offer a scalable, fast, non-volatile and low energy memristive performance. Their dynamic nonlinear current voltage characteristics also suggest applications in nonlinear circuit design and alternative logic architectures.

The bipolar resistive switching behaviour in these devices is treated to a combination of electronic effects at the metal/oxide interfaces and reversible redox reactions and nanoionic transport in transition metal oxide layers. These processes are triggered in the oxide upon the creation of extended defect structures during an electroforming process, under high electrical gradients.

Highly nonlinear and non-volatile memristive characteristics of two-terminal capacity-like metal insulated metal (MIM) devices based on transition metal oxides have attracted intensified research interest due to their potential for the development of highly scalable memory devices. They also promise to be the precursors for novel computing architectures and unconventional computing such as neuromorphic engineering.

Among transition metal oxides, strontium titanate (Sir-$TiO_3$; STO), the archetypal perovskite oxide has emerged as a promising candidate for the functional oxide layer in memristive MIM devices. Its self-doping tendency with oxygen vacancies subject to electrical or thermal stress can transform its electronic structure from a band insulator to a metallic conductor and facilitate electroresistive switching suitable for two-terminal memory devices. Strontium titanate has shown great potential for nanoscale resistive switching applications due to the inherent tendency of the stable perovskite structure of STO to harbour oxygen vacancy point defects and a pronounced redox activity along the dislocations in the titanium oxide sub-lattice.

The resistive switching in STO based devices is generally attributed to highly localised accumulation of oxygen vacancies (i.e. nanofilaments) along the extended defect structures, which result in the local bypassing of the depletion layer at the metal-oxide interfaces. Additionally, the defect structure of STO can be directly manipulated via doping with a donor- or acceptor-type transition metal, which can be employed to modulate the electronic structure at local (e.g. grain boundaries and point defects) and bulk levels. This can be used as a tool to engineer the arrangement and electronic/ionic transport properties of nanofilaments, and therefore, the memristive properties of STO-based devices. As such, STO-based devices have the potential for high density integration as passive analog memory elements in computing architectures. Moreover, the tunability of the STO structure with respect to coupled electromechanical and electro-optical effects highlights the impressive degree of freedom it can render in the design of multifunctional nonlinear devices.

However, the high processing temperatures and non-CMOS compatible substrates typically employed in fabricating STO-based memristor devices can create a barrier to the commercialisation of these devices.

The present invention seeks to provide a memristor device and a method of fabrication thereof, which may overcome or substantially ameliorate at least some of the deficiencies of the prior art, or to at least provide an alternative.

SUMMARY OF INVENTION

According to a first aspect of the present invention, there is provided a memristor device comprising:
a first electrode;
a second electrode;
a cathode metal layer disposed on a surface of the first electrode; and
an active region disposed between and in electrical contact with the second electrode and the cathode metal layer, the active region comprising at least one layer of an amorphous metal oxide,
wherein when a switching voltage is applied between the first and second electrodes, the active region exhibits a resistive switching behaviour.

Preferably, the at least one layer of amorphous metal oxide includes an oxide of titanium.

Preferably, the at least one layer of amorphous metal oxide includes an oxygen deficient amorphous metal oxide.

In one embodiment, the oxygen deficient amorphous metal oxide includes a strontium titanate expressed by a formula (amorphous —$SrTiO_{3-x}$), wherein $0.05 < x < 0.15$.

Preferably, the at least one layer of amorphous metal oxide comprises an oxygen deficient amorphous metal oxide layer and an amorphous metal oxide layer.

In one embodiment, the oxygen deficient amorphous metal oxide layer includes a strontium titanate expressed by a formula (amorphous —$SrTiO_{3-x}$), wherein $0.05 < x < 0.15$, and the amorphous metal oxide layer includes a strontium titanate expressed by a formula (amorphous —$SrTiO_3$).

In an alternative embodiment, each of the oxygen deficient amorphous metal oxide layer and the amorphous metal oxide layer has a thickness that falls within the range of about 15 nm to about 40 nm.

Preferably, the oxygen deficient amorphous metal oxide comprises doping atoms of a dopant element selected from the group consisting of chromium and niobium.

In one embodiment, the oxygen deficient amorphous metal oxide is a strontium titanate expressed by a formula (amorphous —$SrTiO_{3-x}$), wherein $0.05<x<0.15$, and the dopant element is niobium.

Suitably, the ratio of niobium to titanium is between about 0.02 and about 0.05.

Preferably, the least one layer of an amorphous metal oxide has a thickness that falls within the range of about 15 nm to about 40 nm.

Preferably, the cathode metal layer has a thickness that falls within the range of about 2 nm to about 15 nm.

In one embodiment, the cathode metal layer has a thickness that falls within the range of about 5 nm to about 10 nm.

Preferably, each of the first and second electrodes has a thickness that falls within the range of about 25 nm to about 35 nm.

Preferably, the resistive switching behaviour comprises a bipolar resistive switching behaviour that occurs in one or both of a forward direction and a reverse direction.

Preferably, the resistive switching behaviour comprises a bipolar resistive switching behaviour that occurs in one or more of a forward direction, a reverse direction, and a complementary resistive switching behaviour.

According to a second aspect of the present invention, there is provided a method of fabricating a memristor device, the method comprising the steps of:
a) providing a first electrode;
b) providing a second electrode;
c) providing a cathode metal layer disposed on a surface of the first electrode; and
d) providing an active region disposed between and in electrical contact with the second electrode and the cathode metal layer, the active region comprising at least one layer of an amorphous metal oxide,
wherein when a switching voltage is applied between the first and second electrodes, the active region exhibits a resistive switching behaviour.

Preferably, one or more of steps a) to d) is conducted at room temperature.

According to a third aspect of the present invention, there is provided a method of fabricating a memristor device, the method comprising the steps of:
a) depositing a bottom electrode on a substrate;
b) depositing at least one layer of an amorphous metal oxide on the deposited bottom electrode to define an active region;
c) depositing a cathode metal layer on the at least one layer of the amorphous metal oxide; and
d) depositing a top electrode on the deposited cathode metal layer, such that the active region is disposed between, and in electrical contact with, the bottom electrode and the cathode metal layer,
wherein when a switching voltage is applied between the top and bottom electrodes, the active region exhibits a resistive switching behaviour.

Preferably, one or more of steps a) to d) is conducted at room temperature.

Other aspects of the invention are also disclosed.

BRIEF DESCRIPTION OF THE DRAWINGS

Notwithstanding any other forms which may fall within the scope of the present invention, preferred embodiments of the invention will now be described, by way of example only, with reference to the accompanying drawings in which:

FIG. 1 shows (a) a schematic cross-sectional view of an a-$STO_x$ MIM device produced in accordance with a preferred embodiment of the present invention, and (b) a chart illustrating a current-voltage relationship of an a-$STO_x$ MIM single layer device of FIG. 1 (a) comprising an oxygen-deficient amorphous-$STO_x$ (hereinafter referred to as a-$STO_x$) switching layer thickness, $L_1$, of 30 nm and a titanium cathode layer thickness, $L_T$, of 5 nm, which reveals a representative bipolar resistive switching behaviour;

FIG. 2 shows (a) a schematic cross-sectional view of an a-$STO_x$/a-STO bilayer MIM device produced in accordance with another preferred embodiment of the present invention, and charts illustrating a current-voltage relationship of the a-$STO_x$/a-STO bilayer MIM device of FIG. 2(a), which reveal (b) forward bipolar resistive switching behaviour, (c) complementary resistive switching behaviour, and (d) reverse bipolar resistive switching behaviour; and FIG. 3 shows (a) a chart illustrating the rate of oxygen vacancy concentration vs. oxygen pressure for oxygen-deficient a-$STO_x$ switching layers deposited on a Si/$SiO_2$ substrate by RF magnetron sputtering at room temperature, and (b) a chart illustrating the rate of growth of oxygen-deficient a-$STO_x$ switching layers vs. plasma discharge power at 0% oxygen partial pressure.

DETAILED DESCRIPTION OF SPECIFIC EMBODIMENTS

It should be noted in the following description that like or the same reference numerals in different embodiments denote the same or similar features.

Single Layer Device

Figure 1:
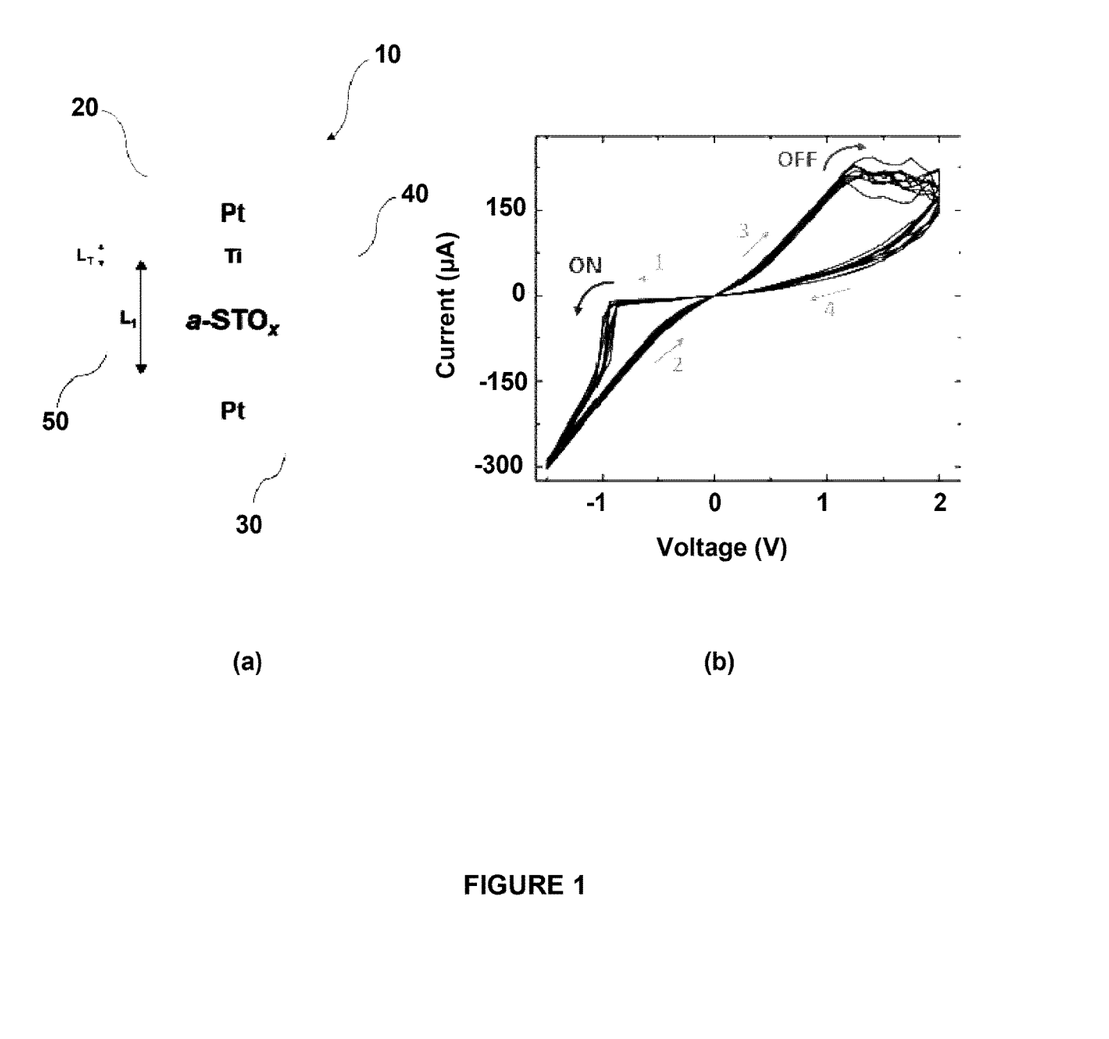

As shown in FIG. 1(a) there is provided a schematic cross-sectional view of a representative single layer memristor device 10 produced according to a preferred embodiment of the present invention. The single layer device 10 is a stacked passive to terminal metal insulated metal (MIM) device or cell that comprises first and second electrodes 20, 30 that act as the top and bottom electrodes, respectively, of the single layer MIM device 10. The first and second electrodes 20, 30 are inert high work function metal electrodes that are produced from a metal selected from the group consisting of platinum, palladium, gold, tungsten and titanium nitride.

In a preferred embodiment, the first and second electrodes 20, 30 are formed from platinum metal, each having a thickness that falls within the range of about 25 nm to about 35 nm.

As shown in FIG. 1(a), the first or top platinum electrode 20 has a cathode metal layer 40 disposed on an inwardly facing surface thereof. The cathode metal layer 40 is ideally a reactive low work function metal selected from the group consisting of platinum, palladium, gold, palladium-silver, ruthenium and iridium.

In a preferred embodiment, the cathode metal layer 40 is formed from titanium metal having a thickness that falls within the range of about 2 nm to about 15 nm, more preferably, a thickness that falls within the range of about 5 nm to about 10 nm.

Disposed substantially between, and in electrical contact with, the second or bottom platinum electrode 30 and the titanium cathode layer 40 is an active region that comprises a switching layer in the form of an amorphous metal oxide 50. The amorphous metal oxide switching layer 50 takes the form of a near stoichiometric, oxygen-deficient amorphous perovskite ternary metal oxide layer of strontium titanate expressed by the formula amorphous-$SrTiO_{3-x}$ (hereinafter referred to as a-SrTiO$_{3-x}$), wherein $0.05<x<0.15$ (hereinafter, referred to in the shortened notational form as a-STO$_x$).

In one embodiment, the oxygen-deficient a-STO$_x$ switching layer 50 has a thickness that falls within the range of about 15 nm to about 40 nm, more preferably, within the range of about 15 nm to about 30 nm, still more preferably, within the range of about 15 nm to about 25 nm.

Method

The inventors have found that a desirable requirement for achieving a versatile resistive switching single layer MIM device 10 is low or no initial electrical stress (or electroforming voltage/current) to induce the metal-insulator transition in the single layer MIM device 10. As will be described below, three fabrication parameters may be employed to control the electroforming voltage/current threshold in the single layer MIM device 10 of the preferred embodiments of the present invention.

Control of the Oxygen Deficiency Content in a-STO Oxide Switching Layer:

the synthesis technique of choice for depositing a-STO switching layers is RF magnetron sputtering in an Ar/O$_2$ sputtering gas mixture using a stoichiometric SrTiO$_3$ ceramic target. By controlling the background oxygen partial pressure in the RF plasma, the oxygen content in the deposited a-STO switching layer 50 can be controlled. The inventors have found that high oxygen deficiency content in the a-STO$_x$ switching layer 50 of a single layer MIM device 10 facilitates lower energy requirements for initial electroforming.

Figure 3:
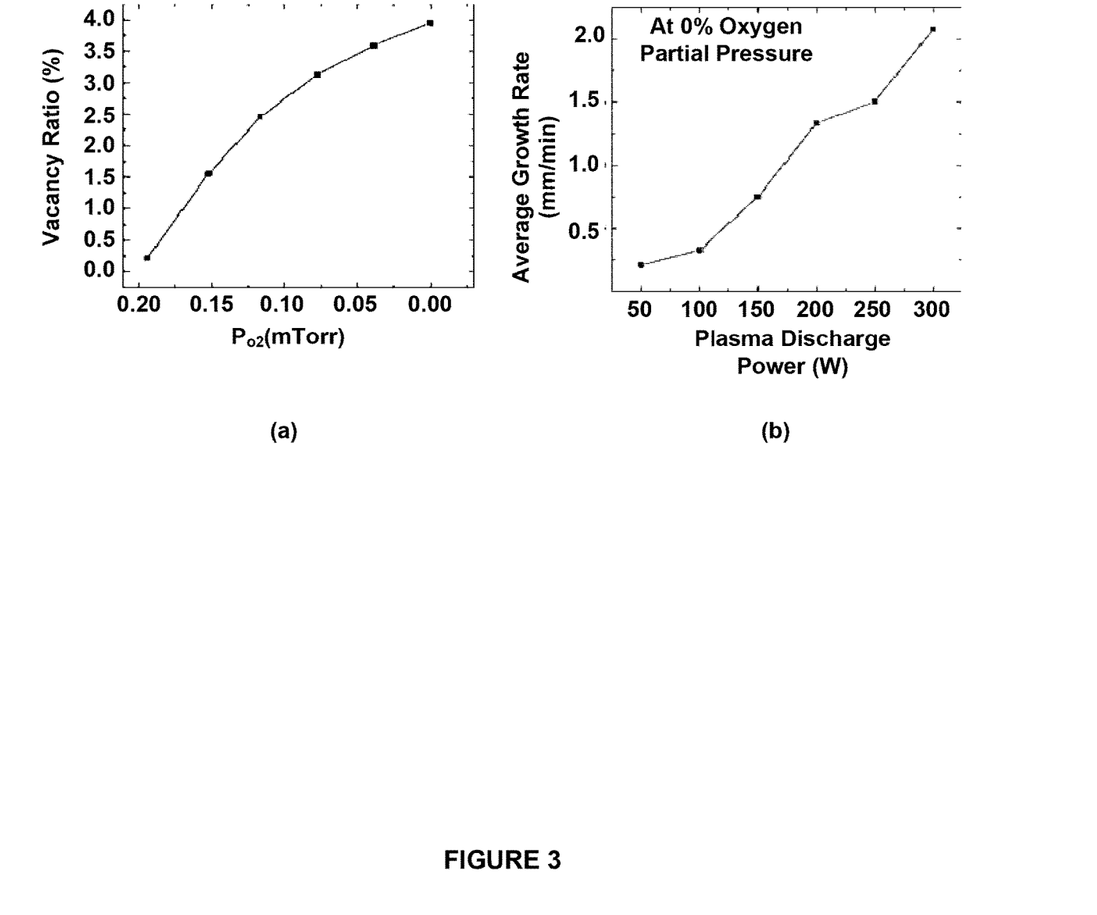

FIG. 3(a) shows a chart illustrating the dependence of the rate of oxygen vacancy concentration vs. oxygen pressure for oxygen-deficient a-STO$_x$ switching layers 50 deposited on a Si/SiO$_2$ substrate by RF magnetron sputtering at room temperature. By virtue of being able to control the oxygen deficiency in the oxide switching layer 50 of the single layer and bilayer MIM devices 10, 100, it is possible to facilitate lower energy requirements for initial electroforming and more uniform switching performance with higher device yield and endurance.

Control of Oxide Thickness/Density:

sputtering power, duration and target to substrate distance can be employed to control the oxide layer thickness and density during the RF sputtering deposition. With a moderate RF power (100 W) and a large target to substrate distance (50 cm) in a "sputter-up" configuration, the thickness of the oxide layers can be controlled uniformly down to <5 nm. The oxygen-deficient a-STO$_x$ switching layer 50 used in the single layer MIM device 10 may be varied in thickness between 10 and 40 nm and preferably between 15 and 40 nm to optimize the resistive switching performance of the resulting single layer MIM device 10.

FIG. 3(b) shows a chart illustrating the dependence of the rate of growth of oxygen-deficient a-STO$_x$ switching layers 50 vs. plasma discharge power at 0% oxygen partial pressure. By virtue of being able to control the thickness of the oxygen-deficient a-STO$_x$ switching layers 50 in the single layer or bilayer MIM devices 10, 100, it is possible to influence the overall initial MIM cell resistance and allow for archiving the critical thickness for low or no electroforming step.

In short, the above approach allows precise control over the thickness of the oxygen-deficient a-STO$_x$ switching layer 50 and the oxygen deficiency concentration. In particular, using different oxygen partial pressures, the inventors have found that multi-layered or stacked films can be deposited on the substrate with ease. Since the deposition occurs at room temperature, inter-diffusion between the as-grown amorphous oxygen-deficient a-STO$_x$ switching layer 50 with defect vacancy profiles is unlikely, and in a worst case scenario, limited to 2-3 nm. Thus the electrical transport properties of each individual layer can be employed to optimize the overall stack's performance.

Thickness of the Cathode Metal:

the thickness of the titanium cathode layer 40 in the single layer MIM device 10 influences the initial resistance and electrical characteristics of the single layer MIM device 10. At a critical thickness, the designed asymmetry in the single layer MIM device 10 allows for robust resistive switching at lower energies.

A method of fabricating a single layer MIM device 10 according to a preferred embodiment of the present invention will now be described.

According to step 1) of the method, a bottom platinum electrode 30 of 25 nm thickness is deposited onto a pre-patterned SiO$_2$/Si substrate by electron beam evaporation at room temperature. Adhesion between the pre-patterned SiO$_2$/Si substrate and the bottom platinum electrode 30 may be enhanced by virtue of depositing an adhesion promoting layer of TiO$_2$ of thickness 5 nm onto the pre-patterned SiO$_2$/Si substrate prior to applying the bottom platinum electrode 30.

According to step 2), an oxygen-deficient a-STO$_x$ switching layer 50 of 30 nm thickness is sputtered through a shadow mask onto the bottom platinum electrode 30 by RF magnetron sputtering at room temperature in an Ar/O$_2$ sputtering gas mixture using a stoichiometric SrTiO$_3$ ceramic target at a base pressure of <10$^{-7}$ Torr.

The inventors have found that a preferred partial pressure range to attain single phase perovskite oxide layers is 0-5%, whereupon a 5% oxygen partial pressure yields stoichiometric a-STO thin films and 0% partial pressure yields a maximum oxygen deficiency content of 3-4% in the oxide switching layer 50.

Good results have been obtained for a single layer MIM device 10 in which the oxygen-deficient switching layer (a-STO$_x$) 50 is synthesized at 0% oxygen partial pressure and has a 3-4% oxygen deficiency content.

According to step 3), a titanium cathode layer 40 of thickness 5 nm is first deposited onto the sputtered oxygen-deficient a-STO$_x$ switching layer 50 by electron beam evaporation at room temperature.

According to step 4), a top platinum electrode 20 of thickness 25 nm is deposited onto the titanium cathode layer 40 using the same electron beam evaporation apparatus, again at room temperature.

It will be appreciated by those skilled in the relevant art that the fabrication method described above is not limited to depositing the individual layers by sputtering, but that other deposition methods including thermal evaporation, electron beam evaporation, atomic layer deposition, co-deposition, chemical vapour deposition, ion beam assisted deposition, may also be employed.

The inventors have found that by virtue of the titanium cathode layer 40 being located between, and in electrical contact with, the top platinum metal electrode 20 and the oxygen-deficient a-STO$_x$ switching layer 50, the resulting asymmetry within the single layer MIM device 10 enables a high-performance non-linear resistive switching to be achieved.

The thickness of the oxygen-deficient a-STO$_x$ switching layer 50 and the titanium cathode layer 40 in the single layer MIM device 10 have been optimized to enable low voltage bipolar resistive switching behaviour.

Good results have been obtained for a single layer MIM device 10 that comprises first and second platinum electrodes 20, 30, each having a thickness of 20 nm, a titanium cathode layer 40 having a thickness, $L_T$, of 5 nm and an oxygen-deficient a-STO$_x$ layer 50 having a thickness, $L_1$, of 30 nm.

The inventors have also found that when a switching voltage is applied between the first and second platinum electrodes 20, 30 of the single layer MIM device 10, the oxygen-deficient a-STO$_x$ switching layer 50 exhibits a bipolar resistive switching behaviour that occurs in one or both of a forward direction and a reverse direction.

FIG. 1(b) shows a chart illustrating a current-voltage relationship of a single layer a-STO$_x$ based MIM device 10 having the above stated dimensions when a bias voltage is applied between the first and second electrodes 20, 30 of the single layer MIM device 10.

At the origin of FIG. 1(b), in which no bias voltage is applied, it will be appreciated that the single layer MIM device 10 persists in the OFF state. However, when a bias voltage is applied to the single layer MIM device 10 from about 0 V to about −1.5 V, biased from the top platinum electrode 20, the single layer MIM device 10 experiences a path of high resistance (path 1) until the current reaches about −5 μA at a voltage of about −1 V. At this point, the single layer MIM device 10 switches to the ON state, where the current increases to about ~330 μA until the voltage reaches −1.5 V, corresponding to a low resistance state. When a voltage is subsequently applied from about 0 V to about +2 V, the current starts to decrease while the single layer MIM device 10 experiences a path of low resistance (along path 2). As the current and voltage pass through the origin and along path 3, the current increases to about +225 pA at a voltage of about +1.2 V. At this point, the single layer MIM device 10 switches to the OFF state, whereupon the current gradually decreases until the voltage reaches about +2 V. When the bias voltage is reduced to about 0 V, the OFF state is maintained as the current decreases back to zero and the single layer MIM device 10 experiences a path of high resistance (path 4).

The inventors have found that typical voltage ranges for achieving forward bipolar resistive switching in the single layer MIM device 10 are around −1.5 V to +2 V.

Thus, when a voltage is applied in a negative polarity between the first and second platinum electrodes 20, 30, biased from the top platinum electrode 30, the single layer MIM device 10 switches from a high resistance state to a low resistance state. On the other hand, when a voltage is applied in a positive polarity, again biased from the top platinum electrode 30, the single layer MIM device 10 switches from a low resistance state to a high resistance state. This bipolar resistive switching behaviour may be performed repeatedly in the same manner, corresponding to a stable non-volatile bipolar switching characteristic, as indicated by the hysteresis resulting from the cycle of operation.

The inventors have found that the average OFF/ON switching ratio for the single layer MIM device 10 is in the range of $10^2$ to $10^3$.

Whilst not wishing to be bound by any one particular theory, the bipolar switching behaviour of transition metal oxide layers in a stacked MIM device is generally perceived to be originating from inhomogeneous conduction mechanisms through localized filamentary pathways.

In the case of the single layer MIM device 10, by virtue of the controlled defect-rich structure of the a-STO$_x$ switching layer 50 resulting from the oxygen-deficiency, this allows a conductive filamentary pathway (not shown) to be formed between the bottom platinum electrode 30 and the titanium cathode layer 40 of the single layer MIM device 10 when a sufficiently high bias voltage is applied between the first and second platinum electrodes 20, 30. Once the conductive filament pathway has been formed, it may be reset or set by a suitable voltage applied across the structure of the single layer MIM device 10 to provide desirable memristive properties.

Bilayer Device

As shown in FIG. 2(a) there is provided a schematic cross-sectional view of a representative bilayer layer memristor device 100 produced according to another preferred embodiment of the present invention.

The bilayer MIM device 100 as shown in FIG. 2(a) comprises the same or similar components that make up the single layer MIM device 10 described above, albeit with an additional amorphous metal oxide layer 60 of strontium titanate, expressed by the formula a-SrTiO$_3$ (hereinafter, referred to in the shortened notational form as a-STO), disposed substantially between the titanium cathode layer 40 and the oxygen-deficient a-STO$_x$ switching layer 50.

Referring to the method of fabricating a single layer MIM device 10 described above, prior to step 3) of this method, the fabrication of the bilayer MIM device 100 involves the additional step, step 3a), of depositing the a-STO switching layer 60 onto the oxygen-deficient a-STO$_x$ switching layer 50 by sputtering through a shadow mask using RF magnetron sputtering at room temperature in an Ar/O$_2$ sputtering gas mixture using a stoichiometric SrTiO$_3$ ceramic target at a base pressure of <$10^{-7}$ Torr.

Good results have been obtained for a bilayer MIM device 100 in which the oxygen-deficient switching layer (a-STO$_x$) 50 is synthesized at 0% oxygen partial pressure and has a 3-4% oxygen deficiency content, while the stoichiometric (a-STO) switching layer 60 is synthesized at 5% partial pressure. The inventors have found that this combination is most suited to resistive switching device applications.

It will be understood by those skilled in the relevant art that the titanium cathode layer 40 in the bilayer MIM device 100 performs according to the same or similar principles as in the single layer MIM device 10.

In one embodiment, each of the oxygen deficient a-STO$_x$ switching layer 50 and the a-STO switching layer 60 of the bilayer MIM device 100 has a thickness that falls within the range of about 15 nm to about 40 nm, more preferably, within the range of about 15 nm to about 30 nm, still more preferably, within the range of about 15 nm to about 25 nm.

Good results have been obtained for a bilayer MIM device 100 that comprises first and second platinum electrodes 20, 30, each having a thickness of 20 nm, a titanium cathode layer 40 having a thickness, $L_T$, of 5 nm, an a-STO switching layer 60 having a thickness, $L_2$, of 20 nm and an oxygen-deficient a-STO$_x$ switching layer 50 having a thickness, $L_1$, of 20 nm.

Referring to FIG. 2(b), there is shown a chart illustrating a current-voltage relationship of a bilayer MIM device 100 having the above stated dimensions when a bias voltage is applied between the first and second platinum electrodes 20, 30 of the bilayer MIM device 100.

At the origin of FIG. 2(b), in which no bias voltage is applied, it will be appreciated that the bilayer MIM device 100 persists in the OFF state. However, when a bias voltage is applied to the bilayer MIM device 100 from about 0 V to about −3 V, biased from the top platinum electrode 20, the bilayer MIM device 100 experiences a path of high resistance (path 1) until the current reaches a limit of about −5 μA at a voltage of about −1.8 V. At this point, the bilayer MIM device 100 switches to the ON state, where the current increases to about −70 μA until the voltage reaches −2.5 V corresponding to a low resistance state. When a voltage is subsequently applied from about 0 V to about +4 V, the current starts to decrease and the bilayer MIM device 100 experiences a path of low resistance (along path 2). As the current and voltage pass through the origin and along path 3, the current increases to about +85 pA at a voltage of about +3.8 V. At this point, the bilayer MIM device 100 switches to the OFF state. When the bias voltage is reduced to about −0 V, the OFF state is maintained as the current falls back to zero as the bilayer MIM device 100 experiences a path of high resistance (path 4). Application of a bias voltage in the low voltage ranges before reaching switching thresholds may not disturb the switching state so that the device may be stable for READ operations.

The inventors have found that typical voltage ranges for achieving forward bipolar resistive switching in the bilayer MIM device 100 are around −1.5 V to +3 V.

Thus, as in the case of the single layer MIM device 10 (see FIG. 1(b)), when a voltage is applied in a negative polarity between the first and second platinum electrodes 20, 30 biased from the top platinum electrode 30, the bilayer MIM device 100 switches from a high resistance state to a low resistance state. On the other hand, when a voltage is applied in a positive polarity, again biased from the top platinum electrode 30, the bilayer MIM device 100 switches from a low resistance state to a high resistance state. This bipolar resistive switching behaviour may be performed repeatedly in the same manner, corresponding to a stable non-volatile bipolar switching characteristic, as indicated by the hysteresis resulting from the cycle of operation. Application of a bias voltage in the low voltage ranges before reaching switching thresholds may not disturb the switching state so that the device may be stable for READ operations.

The inventors have found that the introduction of the additional a-STO switching layer 60 further limits the overall conduction in the bilayer MIM device 100 in either switching regimes (low or high resistance) while keeping the bilayer MIM device 100 forming free. This may allow for resistive switching operation with lower energy requirements.

As in the case of the single layer MIM device 10 described above, the inventors have found that by varying the thicknesses of each of the individual layers of the bilayer MIM device 100 it is possible to fine tune the memristive properties. Indeed, the inventors have found that switching ratios of up to $10^3$ are achievable in the bilayer MIM device 100.

Another aspect of the bilayer MIM device 100 is the potential for achieving complementary resistive switching and reversal of the switching polarity.

In the case of complementary resistive switching (CRS), and referring specifically to FIG. 2(c), there is shown a chart illustrating a current-voltage relationship of a bilayer layer MIM device 100 having the above stated dimensions when a bias voltage is applied between the first and second platinum electrodes 20, 30 of the bilayer MIM device 100.

The inventors have found that typical voltage ranges for achieving full range CRS-type switching in the bilayer MIM device 100 are around −3 V to +3 V in one example.

Thus, as the chart in FIG. 2(c) reveals, by increasing the voltage in the bilayer MIM device 100, it can operate as a single cell CRS device. In FIG. 2(c) $V_{NTH1}$ indicates the start of a first or ON state switching region and $V_{PTH1}$ indicates the start of a second or OFF state switching region (or vice versa). Conversely, $V_{NTH2}$ indicates the end of the first or ON state switching region and $V_{PTH1}$ indicates the end of the second or OFF state switching region (or vice versa).

In the case of reversal of the switching polarity of the bilayer MIM device 100, and referring specifically to FIG. 2(d), there is shown a chart illustrating a current-voltage relationship of a bilayer layer MIM device 100 having the above stated dimensions when a bias voltage is applied between the first and second platinum electrodes 20, 30 of the bilayer MIM device 100 (biased from the top platinum electrode 30). The reversal may be achieved by applying a bias in the positive polarity equal to $V_{PTH1}$ or in negative polarity equal to $V_{NTH1}$. These two thresholds may be used to reverse the switching polarity from FIG. 2(b) to FIG. 2(d) and vice versa.

At the origin of FIG. 2(d), in which no bias voltage is applied, it will be appreciated that the bilayer MIM device 100 persists in the OFF state. However, when a bias voltage is applied to the bilayer MIM device 100 from about 0 V to about +3 V, biased from the bottom platinum electrode 20, the bilayer MIM device 100 experiences a path of high resistance (path 1) until a voltage of about +1.7 V. At this point, the bilayer MIM device 100 switches to the ON state, where the current starts to increase until the voltage reaches +2.2 V resulting in a current of about +50 μA corresponding to a low resistance state. When a voltage is subsequently applied from about +3 V to about −5 V, the current starts to decrease and the bilayer MIM device 100 experiences a path of low resistance (along path 2, through the origin and along path 3) until the current reaches about −85 μA at a voltage of about −3.5 V. At this point, the bilayer MIM device 100 switches to the OFF state. When the bias voltage is increased to about +3 V again, the current falls back to zero as the bilayer MIM device 100 experiences a path of high resistance (path 4). The reversal may be achieved by applying a bias in the positive polarity equal to $V_{PTH1}$ or in negative polarity equal to $V_{NTH1}$. These two thresholds can be used to reverse the switching polarity from FIG. 2(b) to FIG. 2(d) and vice versa.

The inventors have found that typical voltage ranges for reverse bipolar resistive switching in the bilayer MIM device 100 are around −3 V to +1.5 V.

Thus, when a voltage is applied in a positive polarity between the first and second platinum electrodes 20, 30 biased from the top platinum electrode 30, the bilayer MIM device 100 switches from a low resistance state to a high resistance state. On the other hand, when a voltage is applied in a negative polarity, again biased from the top platinum electrode 30, the bilayer MIM device 100 switches from a high resistance state to a low resistance state. This bipolar resistive switching behaviour is performed repeatedly in the same manner, corresponding to a stable non-volatile bipolar switching characteristic, as indicated by the hysteresis resulting from the cycle of operation. Application of a bias voltage in the low voltage ranges before reaching switching thresholds may not disturb the switching state so that the device may be stable for READ operations.

In short, the inventors have found that the same behaviour can be used to utilize the bilayer MIM device 100 for switching in opposite polarities.

Again, whilst not wishing to be bound by any one particular theory, the inventors perceive that the complementary resistive switching (CRS) behaviour observed in the bilayer MIM device 100 involves a reversal in the charge distribution and polarity of the a-STO switching layer 60 and the oxygen-deficient a-$STO_x$ switching layer 50, which infers that when one of the two oxide switching layers of the bilayer MIM device 100 is switched ON, the current flow causes the other oxide switching layer to switch OFF. This is in stark contrast to the result achieved employing the conventional approach of using two individual single layer MIM devices (not shown) connected together in an anti-serial manner.

On the other hand, if the voltage sweep applied between the first and second platinum electrodes 20, 30 of the bilayer MIM device 100 is stopped once reaching the threshold for switching one of the two oxide switching layers ON (equally for pulse bias, if a voltage pulse is around the first threshold voltage), then that oxide switching layer (or interface) assumes the overall electrical behaviour of the bilayer MIM device 100, and as in the case of the single layer MIM device 10, it behaves as a bipolar switch.

Figure 2:
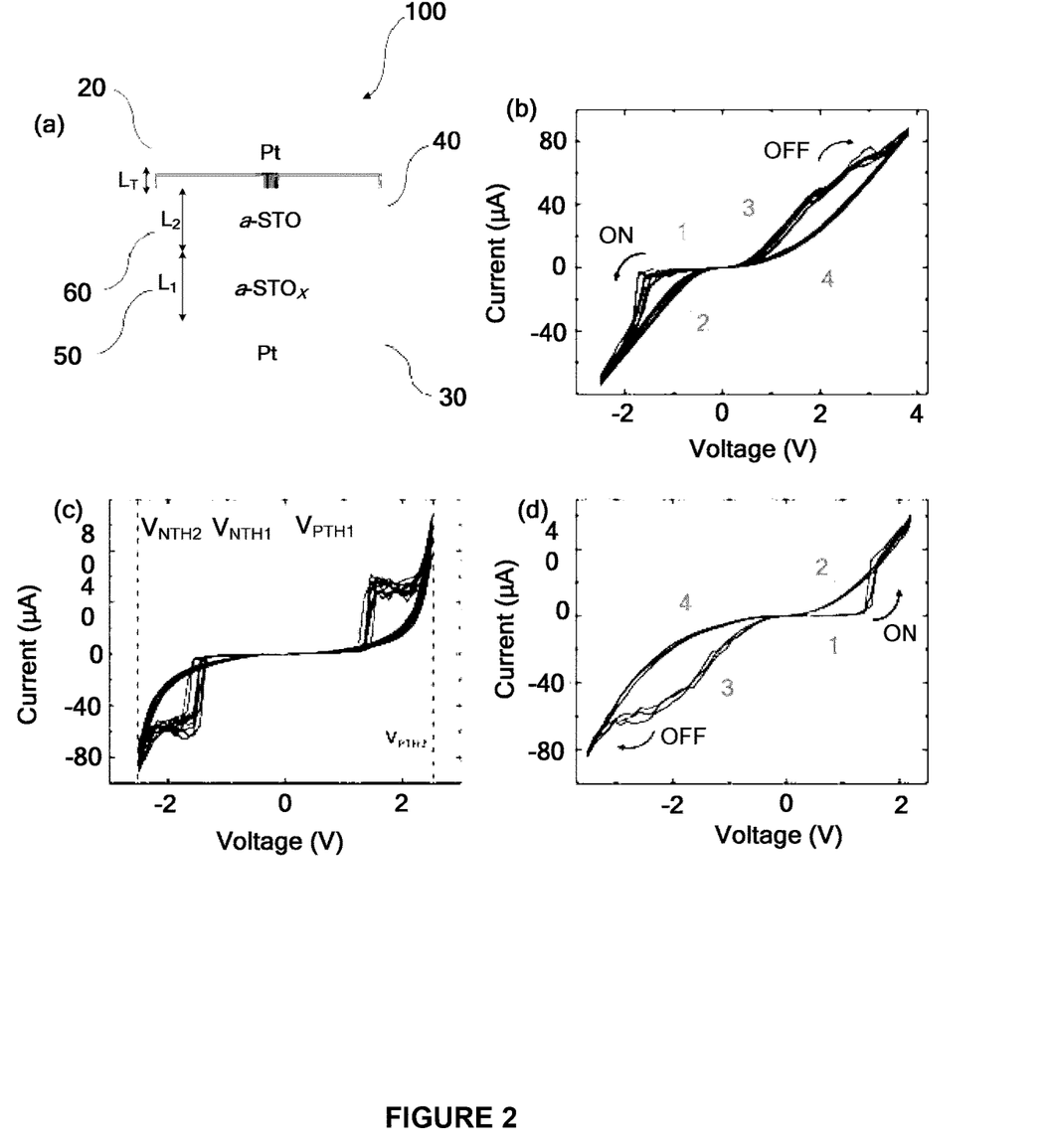

If the polarity of the threshold voltage is changed, as is shown in the chart in FIG. 2(*c*), in which there are threshold voltages in both polarities, then the polarity of the bipolar behaviour is also changed. This means that it is possible to operate the bilayer MIM device 100 in three distinct modes.

Advantages

The single layer MIM device 10 and the bilayer MIM device 100 fabricated according to the method of the present invention provide a number of distinct advantages over conventional STO-based memristor devices.

For instance, the single layer and bilayer MIM devices 10, 100 can be fabricated at room temperature and without requiring post-annealing steps, thereby doing away with the high processing temperatures associated with conventional approaches to fabricating STO-based memristor devices.

In addition, unlike conventional STO-based memristor devices, the single layer and bilayer MIM devices 10, 100 described above may be fabricated through complementary metal-oxide semiconductor (CMOS) compatible processes on conventional Si and $SiO_2$ substrates.

It is possible to fine tune the switching energy and ratio of the single layer and bilayer MIM devices 10, 100 simply by changing the thickness of the oxygen-deficient a-$STO_x$ switching layer 50 in the single layer MIM device 10, and the thickness of one or both of the oxygen-deficient a-$STO_x$ switching layer 50 and the a-STO switching layer 60 in the bilayer MIM device 100.

The bilayer MIM device 100 can be operated in three distinct modes: (i) forward bipolar resistive switching behaviour (ii) reverse bipolar resistive switching behaviour; and (iii) complementary resistive switching (CRS) behaviour.

Other Embodiments

It will be appreciated that the present invention is not limited to the embodiments described above but may include other embodiments.

In another embodiment, it will be understood that the oxygen deficient a-$STO_X$ switching layer 50 of the single layer MIM device 10, or one or both of the oxygen deficient a-$STO_x$ switching layer 50 and the a-STO switching layer 60 of the bilayer MIM device 100, may comprise doping atoms of a particular dopant element to further improve the energy requirements, stability, and controllability of the memristive performance of the single layer and bilayer MIM devices 10, 100. For example, the doping atoms may be selected from the group consisting of chromium and niobium.

In one embodiment, the ratio of titanium to niobium in the oxygen-deficient a-$STO_x$ switching layer 50 of the single layer MIM device 10 is between about 0.02 and about 0.05.

Finally, it is to be understood that various alterations, modifications and/or additions may be introduced into the constructions and arrangements of parts previously described without departing from the spirit or ambit of the invention.

The invention claimed is:

1. A stacked bilayer memristor device comprising:
   a first electrode defining a top electrode;
   a second electrode defining a bottom electrode;
   the first and second electrodes being platinum metal,
   a cathode metal layer disposed on a surface of the first electrode that faces the second electrode;
   the cathode metal layer formed from titanium, and
   an active region disposed between and in electrical contact with the second electrode and the cathode metal layer,
   the active region comprising at least one switching layer of an amorphous metal oxide,
   wherein when a switching voltage is applied between the first and second electrodes,
   the active region exhibits a resistive switching behavior comprising a bipolar resistive switching behavior that occurs in one or more of a forward direction, a reverse direction, and a complementary resistive switching behavior; and
   wherein the at least one switching layer of amorphous metal oxide includes:
   a first amorphous metal oxide layer formed of an oxygen deficient perovskite ternary amorphous metal oxide layer of strontium titanate expressed by a first formula (amorphous —$SrTiO_{3-x}$), wherein $0.05<X<0.15$; and
   a second amorphous metal oxide layer formed from strontium titanate, expressed by a second formula a-$SrTiO_3$, where the first and second formulas differ from each other, and where the second amorphous metal oxide layer is disposed between the cathode metal layer and the first amorphous metal oxide layer, and
   wherein the oxygen deficient amorphous metal oxide comprises doping atoms of a dopant element formed of niobium, wherein the ratio of niobium to titanium is between about 0.02 and about 0.05.

2. A memristor device according to claim 1, wherein the first amorphous metal oxide layer has a thickness of between 15 and 25 nm.

3. A memristor device according to claim 1, wherein each of the oxygen deficient amorphous metal oxide layer and the amorphous metal oxide layer has a thickness that falls within the range of about 15 nm to about 40 nm.

4. A memristor device according to claim 1, wherein the least one layer of an amorphous metal oxide has a thickness that falls within the range of about 15 nm to about 40 nm.

5. A memristor device according to claim 1, wherein the cathode metal layer has a thickness that falls within the range of about 2 nm to about 15 nm.

6. A memristor device according to claim 5, wherein the cathode metal layer has a thickness that falls within the range of about 5 nm to about 10 nm.

7. A memristor device according to claim 1, wherein each of the first and second electrodes has a thickness that falls within the range of about 25 nm to about 35 nm.

8. A method of fabricating a stacked bilayer memristor device, the method comprising the steps of:
   a) providing a first electrode defining a top electrode;

b) providing a second electrode defining a bottom electrode, the first and second electrodes being platinum metal;

c) providing a cathode metal layer disposed on a surface of the first electrode that faces the second electrode, the cathode metal layer formed from titanium; and d) providing an active region disposed between and in electrical contact with the second electrode and the cathode metal layer, the active region comprising at least one switching layer of an amorphous metal oxide, wherein when a switching voltage is applied between the first and second electrodes, the active region exhibits a resistive switching behavior comprising a bipolar resistive switching behavior that occurs in one or more of a forward direction, a reverse direction, and a complementary resistive switching behavior, wherein the at least one switching layer of amorphous metal oxide includes:

a first amorphous metal oxide layer formed of an oxygen deficient perovskite ternary amorphous metal oxide layer of strontium titanate expressed by a first formula (amorphous —$SrTiO_{3-x}$), wherein $0.05<X<0.15$; and a second amorphous metal oxide layer formed from strontium titanate, expressed by a second formula a-$SrTiO_3$, where the first and second formulas differ from each other, and where the second amorphous metal oxide layer is disposed between the cathode metal layer and the first amorphous metal oxide layer, and wherein the oxygen deficient amorphous metal oxide comprises doping atoms of a dopant element formed of niobium, wherein the ratio of niobium to titanium is between about 0.02 and about 0.05.

9. A method according to claim 8, wherein one or more of steps a) to d) is conducted at room temperature.

* * * * *